United States Patent
Parkinson (10) Patent No.: US 8,203,872 B2
(45) Date of Patent: Jun. 19, 2012

(54) METHOD AND APPARATUS FOR ACCESSING A MULTI-MODE PROGRAMMABLE RESISTANCE MEMORY

(75) Inventor: Ward Parkinson, Boise, ID (US)

(73) Assignee: Ovonyx, Inc., Sterling Heights, MI (US)

( * ) Notice: Subject to any disclaimer, the term of this patent is extended or adjusted under 35 U.S.C. 154(b) by 741 days.

(21) Appl. No.: 12/072,411

(22) Filed: Feb. 26, 2008

(65) Prior Publication Data

US 2009/0213644 A1 Aug. 27, 2009

(51) Int. Cl.
*G11C 11/00* (2006.01)

(52) U.S. Cl. ......... 365/163; 365/100; 365/148; 977/754

(58) Field of Classification Search .............. 365/46, 365/94, 100, 113, 129, 148, 163; 257/2–5, 257/9, 296, E31.047, E27.006; 438/29, 95, 438/96, 166, 259, 365, 482, 486, 597; 977/754
See application file for complete search history.

(56) References Cited

U.S. PATENT DOCUMENTS

| | | | | |
|---|---|---|---|---|
| 6,631,085 B2 * | 10/2003 | Kleveland et al. | ............ | 365/175 |
| 6,798,420 B1 * | 9/2004 | Xie | ................. | 345/554 |
| 7,256,790 B2 * | 8/2007 | Valmiki et al. | ............... | 345/530 |
| 7,417,887 B2 * | 8/2008 | Cho et al. | ...................... | 365/148 |
| 2003/0053332 A1 * | 3/2003 | Kleveland et al. | ....... | 365/185.03 |
| 2006/0050548 A1 * | 3/2006 | Oh et al. | ..................... | 365/148 |
| 2006/0256612 A1 * | 11/2006 | Cho et al. | .................... | 365/163 |
| 2007/0121376 A1 * | 5/2007 | Toda | ........................ | 365/185.2 |
| 2008/0285334 A1 * | 11/2008 | Chow et al. | ................... | 365/163 |

* cited by examiner

*Primary Examiner* — Richard Elms
*Assistant Examiner* — Harry W Byrne
(74) *Attorney, Agent, or Firm* — Kevin L. Bray

(57) ABSTRACT

A memory is configurable among a plurality of operational modes. The operational modes may dictate the number of storage levels to be associated with each cell within the memory's storage matrix.

27 Claims, 4 Drawing Sheets

| | Comparator Values | | | | Logic Values | |
|---|---|---|---|---|---|---|
| | Comp 1 | Comp 2 | Comp 3 | R | Binary | Quaternary |
| | Lo | Lo | Lo | R1/R3 | 0 | 00 |
| | Hi | Lo | Lo | R4 | 0 (Undefined) | 01 |
| | Hi | Hi | Lo | R5 | 0 (Undefined) | 10 |
| | Hi | Hi | Hi | R2/R6 | 1 | 11 |

| Comparator Values | | | | Logic Values | |
|---|---|---|---|---|---|
| Comp 1 | Comp 2 | Comp 3 | R | Binary | Quaternary |
| Lo | Lo | Lo | R1/R3 | 0 | 00 |
| Hi | Lo | Lo | R4 | 0 (Undefined | 01 |
| Hi | Hi | Lo | R5 | 0 (Undefined | 10 |
| Hi | Hi | Hi | R2/R6 | 1 | 11 |

METHOD AND APPARATUS FOR ACCESSING A MULTI-MODE PROGRAMMABLE RESISTANCE MEMORY

CROSS-REFERENCE TO RELATED APPLICATIONS

Field of Invention

This invention pertains to accessing programmable resistance memories. More particularly, this invention relates to reading from and writing to a programmable resistance memory device.

BACKGROUND OF THE INVENTION

Programmable resistance memories include a variety of memories, one of which is the phase-change memory. Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In the chalcogenides, the resistivity varies by two or more orders of magnitude when the material passes from the amorphous (more resistive) phase to the crystalline (more conductive) phase, and vice versa. In the amorphous state, moreover, the resistivity depends on the temperature.

A chalcogenide memory device may utilize the wide range of resistance values available for the material as the basis of memory operation. Each resistance value corresponds to a distinct structural state of the chalcogenide material and one or more of the states can be selected and used to define operation memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then cool it off rapidly, i.e. quench. From the electrical standpoint, it is possible to reach the crystallization and melting temperatures by causing a current to flow through a crystalline resistive element that heats the chalogenic material by the Joule effect.

Each memory state of a chalcogenide memory material corresponds to a distinct resistance value and each memory resistance value signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in Science News, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may also be the resultant of a reactive sputtering process with gasses such as N2 or O2: forming a chalcogenide nitride, or oxide, for example and chalcogenide may be modified by an ion implantation or other process.

Although programmable resistance memories, such as OUM-based memories, can address the demands of a variety of applications, the optimal solution for one set of specifications may be at odds with the performance of such a memory in another application. For example, the demand for high speed operation in some applications may work at cross-purposes with the requirement for high density storage in other applications. A memory that can accommodate the demands of high speed operation and high density storage would therefore be highly desirable.

SUMMARY OF THE INVENTION

A memory in accordance with the principles of the present invention is configurable among a plurality of operational modes. Each mode may have associated with it unique writing and/or reading characteristics.

In an illustrative embodiment, a memory may be configured to program a memory cell within the memory to one of a predetermined number of states in one mode and to program the same cell to one of a different predetermined number of states in another mode. Because those modes that feature a greater number of states may require more time to read or write, the memory, or a section of the memory, may be configured to operate with a lower number of states for applications that require higher speeds. For applications in which speed is not so critical, and higher density is desired, the same memory may be configured to operate in a mode that provides higher-density, lower-speed operation.

In an illustrative embodiment at least one programming mode includes four or more program states and one programming mode includes two program states. All, or part, of the memory may be configured to operate in either of the modes.

DETAILED DESCRIPTION

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Accordingly, the scope of the invention is defined only by reference to the appended claims.

Figure 1:
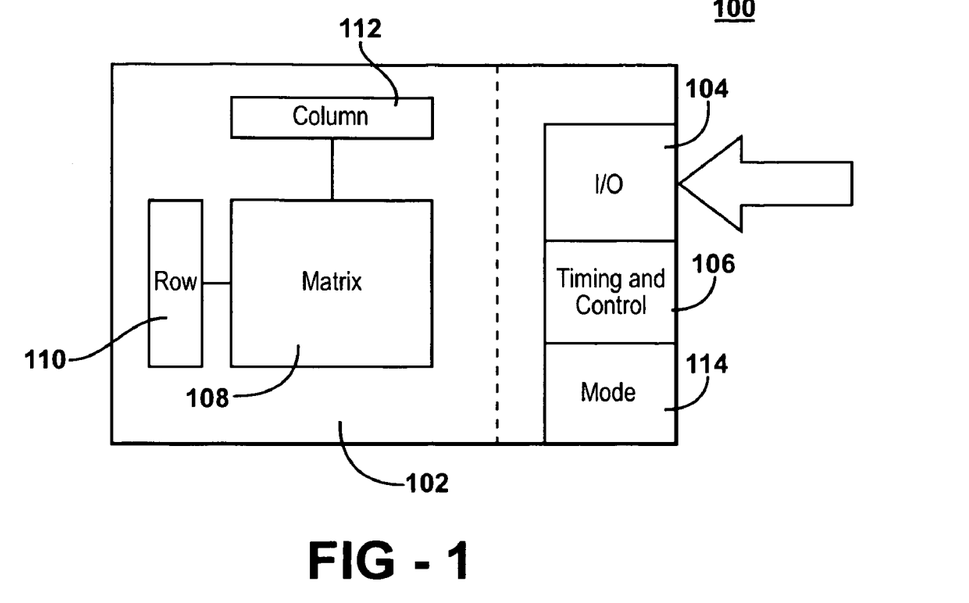
FIG. 1 is a conceptual block diagram of phase change memory in accordance with the principles of the present invention.

As illustrated in the conceptual block diagram of FIG. 1, a memory 100 in accordance with the principles of the present invention includes a memory array 102, input/output (I/O) circuitry 104, and control and timing circuitry 106. The memory array 102 includes a cross-point matrix 108 of memory cells and row 110 and column 112 drivers. The input/output circuitry 104 includes drivers for transmitting signals to circuitry outside the memory array 102, and for receiving signals from circuitry outside the memory array 102. Circuitry outside the memory array for which the input/output 104 circuitry provides an interface may share the same integrated circuit as the memory array 102 or may be located on another "chip." The timing and control circuitry 106 includes mode control circuitry 114.

In accordance with the principles of the present invention, the mode control circuitry may be operated to configure the memory 100 among a plurality of operational modes. Each mode may have associated with it unique writing and/or reading characteristics. In an illustrative embodiment, the memory 100 may be configured to program a memory cell within the memory to one of a predetermined number of logic states in one mode and to program the same cell to one of a greater number of logic states in another mode. The entire memory 100 or a section of the memory (more specifically, the matrix 108) may be configured to operate with a lower number of states for applications that require higher speeds. For applications in which speed is not so critical and higher density is desired, the same memory 100 (more specifically, the matrix 108), or a portion thereof, may be configured to operate in a mode that provides higher-density, lower-speed operation.

Figure 2:
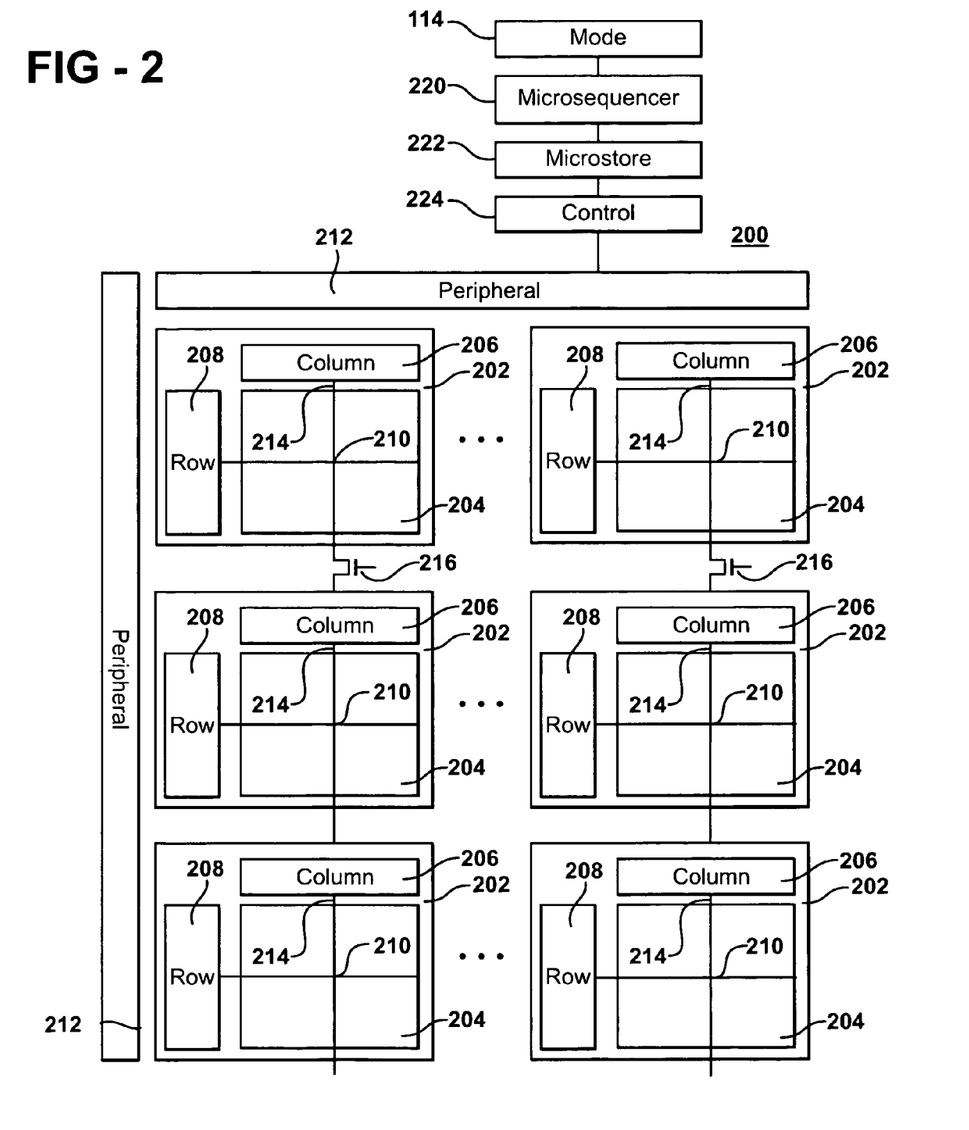
FIG. 2 is a conceptual block diagram of a programmable resistance memory in accordance with the principles of the present invention, with a more detailed view of mode control circuitry utilized in an illustrative embodiment of such a memory.

In the illustrative embodiment of FIG. 2, a multi-mode memory in accordance with the principles of the present invention includes memory access circuitry configured to write data to and read data from a phase-change memory array 200. Phase change memory arrays are known and may be organized, for example, as hierarchical memories. The memory array 200 may include phase change memory cells arranged in a two-dimensional matrix, with row (also referred to as wordline) and column (also referred to as bitline) decoder and driver transistor devices and row and column interconnect conductors, for example. Phase change memory arrays are known and discussed, for example, in U.S. Pat. No. 6,813,177 issued to Lowrey et al, which is hereby incorporated by reference.

Within each block of memory, ADDRESS DECODE, READ, WRITE, and DATA signals are used to determine which cell to access and which operation to perform on the accessed cell. A memory in accordance with the principles of the present invention may employ different current/voltage sources for each operation (e.g., READ, WRITE 00, WRITE 01, WRITE 10, WRITE 11, etc.) or may reconfigure the same sources to perform the variety of access operations. The memory, more particularly in this illustrative embodiment, the control circuitry 224, predetermines not just whether the cell is to be read from or written to, but, additionally, if it is being written to, what state the cell is to be written to. Such operations are described in greater detail below.

The access circuitry includes address, data, and read/write decode circuitry that determines, in response to input from circuitry accessing the memory, what operation (i.e. READ, WRITE 01, WRITE 10, WRITE 11, etc.) will be performed upon what cell within the memory 200. In this illustrative embodiment, mode control circuitry 114 accepts one or more input signals, which could be in the form of nonvolatile memory, an activated fuse or anti-fuse or other mechanism, and controls the memory's mode of operation according to the value of the signal input to the mode control circuitry 114. In this illustrative embodiment, the control circuitry 114 operates on a micro-sequencer 220 to alter the sequencer's path through a micro-instruction store 222; the chosen path being associated with a mode of operation stored in the mode control circuitry 114. The micro-instruction store, in turn, operates on control circuitry 224 to effect the execution of accesses to the memory array 200.

A memory in accordance with the principles of the present invention may employ a hierarchical architecture in which blocks of memory are distributed in an array. In an illustrative embodiment, each block of memory and each bit within the block may be accessed through row and column address buffers and decoders. Information (data or control code, for example) targeted for writing to memory cells within the array may be stored within data buffers then written to the cells in a manner described in greater detail below. Sense amplifiers may be employed to read information from memory cells within the array and to then store the information in data buffers for presentation through input/output circuitry "off-memory."

Decoded addresses, in combination with signals such as READ, WRITE, and data values such as 00, 01, 10, and 11, may be employed to route the appropriate current source to a selected memory cell. In accordance with the principles of the present invention, the state of the mode selection circuit 114 determines in which of a variety of modes the memory 200 will operate. As previously described, the state of the mode selection circuit 114 may be set by activating a fuse or an anti-fuse, for example. Such a mode-selection process may take place during manufacturing, during shipping, during integration with other circuitry, or during a customization process carried out by an end-user, for example.

In an illustrative embodiment, the mode selection circuitry 114 operates in conjunction with a micro-sequencer 220 to step through alternative locations within a microprogram stored within micro-store circuitry 222, depending upon the mode of operation set within the mode circuitry 114. The microprogram coded within the microstore 222 operates control circuitry 224 to access memory cells within the array 200 according to the operation (e.g. READ or WRITE), to data (e.g. 00, 01, 10, or 11), and according to the memory's operational mode (e.g. binary storage or quaternary storage).

In an illustrative embodiment, the control circuitry 224 includes a digital-to-analog converter that controls the amount of current applied to an accessed memory cell. Operating the digital to analog converter according to the stored microprogram allows the memory to apply current pulses of different amplitudes, duration, shape, and frequency in order to effect a variety of access operations. Microprograms, microsequencers and their associated controllers are known and used, for example, in memory self tests. The use of digital to analog converters to produce varied current pulses in a programmable resistance memory is known and described, for example, in "A MULTI-LEVEL CELL BIPOLAR SELECTED PHASE-CHANGE MEMORY," presented by Ferdinando Dedeschi et al, at session 23 of the 2008 IEEE International Solid State Circuits Conference, which is hereby incorporated by reference.

In this illustrative embodiment a memory 200 is organized in an 8×8 array of 64 memory blocks 202. Each block includes an array of memory cells 204 and peripheral circuitry that includes column 206, and row 208 access circuitry that provide access to individual memory cells 210 within each block 202. Peripheral array circuitry 212 includes row and column decoders and drivers, data and address buffers, sense amplifiers and current sources. The peripheral array circuitry 212 provides top-level decoding for access to the memory blocks 202, and switches/enables the appropriate read- or write-buffers, sense amplifiers, and current sources into a selected memory block 202.

In an illustrative embodiment at least one programming mode includes four or more program states and one programming mode includes two program states. All, or part, of the memory may be configured by Mode to operate in any of the program states. A memory in accordance with the principles of the present invention may include different segments of memory types, some more suited to multi-level operation (that is, more than two storage levels), some more suited to binary operation (an operation that employs two storage levels, typically referred to as SET and RESET). The different types of memory segment may be optimized for their respective preferred mode of operation (e.g., multi-level or binary) through use of different phase change material compositions, different cell types, or different cell structures, for example. The Mode maybe hard-wired by use of a non-volatile approach such as bond, laser fuse blowing, or through a soft-wire technique, such as use of an electronic key loaded upon power up, such as from the I/O and stored in volatile or non-volatile on-chip memory.

In accordance with the principles of the present invention, each memory segment or block (by address range or sector) may be configured by Mode to operate in a plurality of program modes, such as binary, or different degrees of multi-level operation such as 4 levels per memory cell (2 logical bits per physical memory cell). Alternately, the analog signal from the memory array (that is, the signal, such as a voltage signal, that is representative of a memory cell's programmed level) may be provided to an external circuit (either directly to a pin or through an analog-to-digital converter), and the Mode control circuit 114 may control external reading and writing.

Additionally, one or more parts of the memory may be allocated by the Mode control circuit 114 to be run in parallel with error correction circuitry (ECC), under the control of the Mode control circuit 114. In this manner, extra memory used in ECC may be freed up when not needed for ECC, and the timing run faster for read and write when the Mode control circuit 114 disables the ECC.

In three-dimensional phase change memory embodiments, in which phase change memory elements may be stacked in layers, one upon one another, different layers or segments of different layers may be configured for operation in different program modes by Mode control circuit 114. Three-dimensional, stacked phase change memory structures are known and disclosed, for example, in U.S. Pat. No. 6,795,338, entitled "Memory Having Access Devices Using Phase Change Material Such As Chalcogenide," which is hereby incorporated by reference.

Figure 3A:
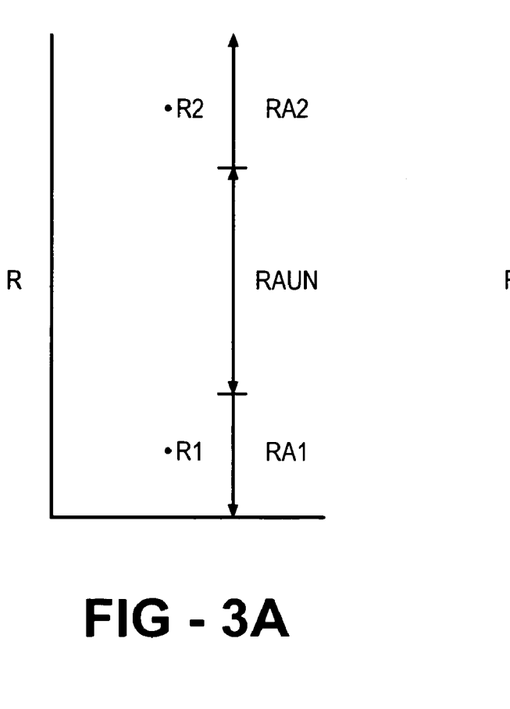
FIGS. 3A and 3B are resistance to logic level mapping diagrams, respectively, for binary and quaternary operational modes in accordance with the principles of the present invention.

In operation, current source(s) within the peripheral circuitry program a selected cell to a resistance value corresponding with one of the levels associated with a given program mode (e.g., SET or RESET for a binary program mode, SET, RESET or one of two intermediate levels for a quaternary program mode, or Set, Reset and one of more than two intermediate levels). The logic level diagram of FIG. 3A depicts the two levels employed in a binary program mode as two resistance values R1 (SET) and R2 (RESET). The program levels R1 and R2 are assigned ranges in order to accommodate variation among cells within a memory. In this illustrative embodiment, a first range RA1 includes resistances from above the nominal resistance R1 down to zero resistance and the second range RA2 includes resistances from slightly below the nominal resistance R2 to the highest measurable resistance.

In this illustrative embodiment, the starting points of ranges RA1 and RA2 may be selected so as to leave an undefined range RAun, which may be minimized or eliminated for two level storage. The starting points of the ranges RA1 and RA2 are chosen to ensure that all valid resistance measurements fall within one of the ranges and that any resistance measurement that falls within the undefined range RAun is invalid. Statistical resistance distributions may be employed to properly set the ranges RA1, RA2, and RAun.

Figure 3B:
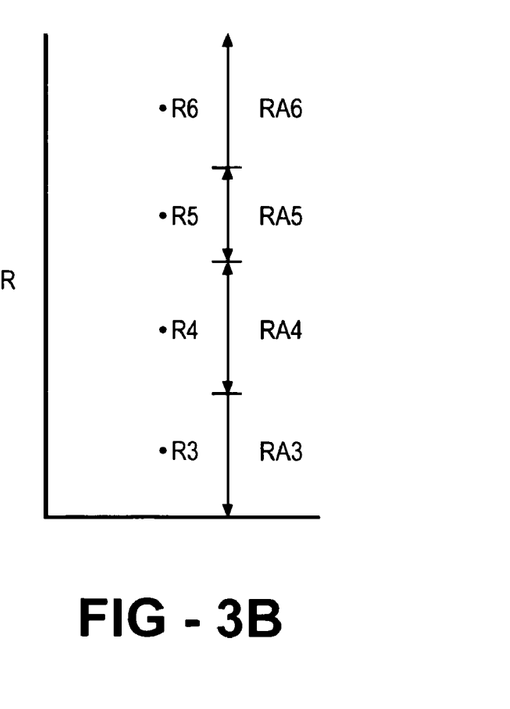

The logic-level diagram of FIG. 3B depicts the resistance values associated with a quaternary logic level program mode such as may be employed in a multi-mode memory in accordance with the principles of the present invention. In this illustrative embodiment the quaternary program mode includes four nominal resistance values R3, R4, R5, and R6, with respective associated ranges RA3, RA4, RA5, and RA6. In this illustrative embodiment, nominal resistance value R3 may be the same resistance value as resistance value R1 of the binary mode of FIG. 3A and nominal resistance value R6 may be about the same resistance value as resistance value R2 of the binary mode of FIG. 3A. Additionally, ranges RA3 and RA6 may be the same ranges, respectively, as ranges RA1 and RA2 of the binary mode depicted in FIG. 3A. Using the same resistance levels and ranges in this manner may ease the task of assigning logic levels to measured resistance values when operating in one of a plurality of possible modes.

In this illustrative embodiment, ranges RA4 and RA5, associated with resistance levels R4 and R5 respectively, divide the range RAun of FIG. 3A. For phase change memory, the range of lower resistance assigned RA4 may be less than the range assigned RA5. In accordance with the principles of the present invention, the ranges and resistance values may be distributed in a different manner; the ranges and resistances in a quaternary mode needn't duplicate the ranges or resistances of a binary mode. Additionally, ranges and resistances need not be evenly distributed throughout the overall resistance range; it may be advantageous to concentrate nominal resistance levels at either end or towards the middle of the available resistance distribution, for example. As a further example, the intersection of RA5 and RA4 in FIG. 3B may be the intersection also used to demarcate the range of resistance resistance RA1 and RA2 in FIG. 3A. This provides more operating region for a Set and Reset bit.

In operation, the peripheral circuitry 212 of FIG. 2 assigns logic values to measured resistance values read from or written to the memory cells, and makes those logic values available to circuits that access the memory 200. In an illustrative embodiment, the peripheral circuitry 202 includes sense amplifiers and comparators that perform the logic level assignment function. In such an embodiment a sense amplifier provides a voltage signal, corresponding to the resistance of a memory cell being read, to a bank of comparators that delimit the ranges RA1-RA6.

Figure 4A:
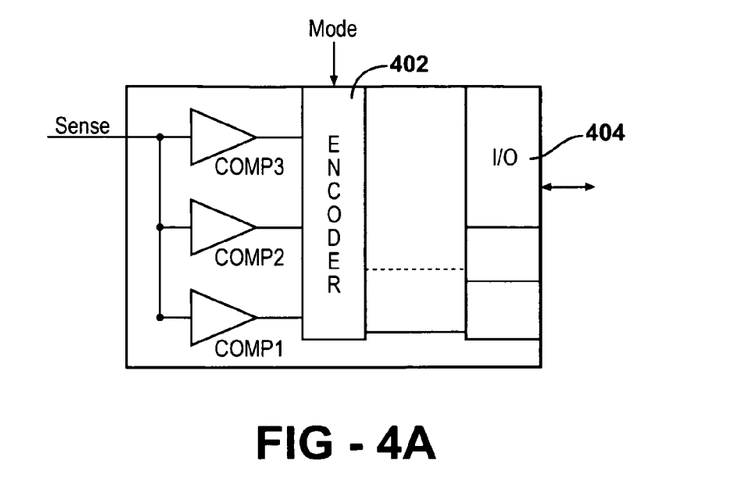
FIG. 4A is a block diagram of a mode-controlled encoder in accordance with the principles of the present invention.
Figure 4B:
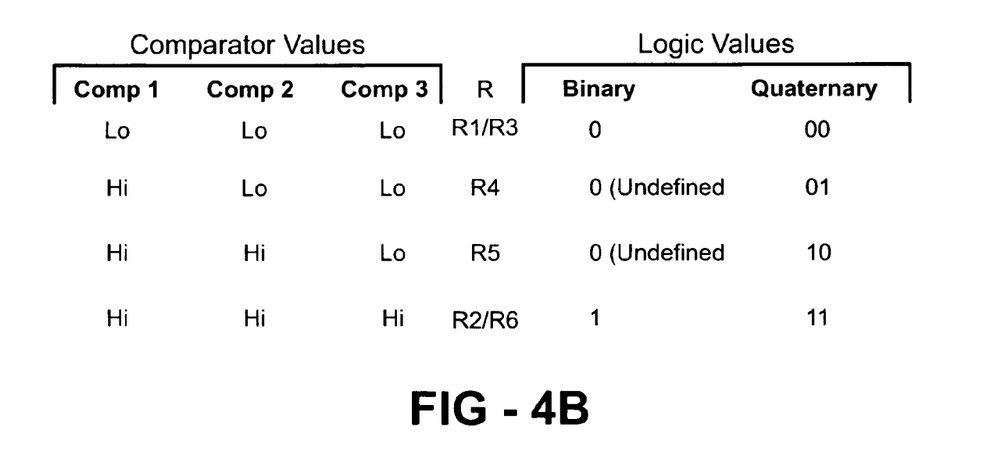
FIG. 4B is a mapping of resistance to logic values such as may be implemented by an encoder in accordance with the principles of the present invention.

The conceptual block diagram of FIG. 4A provides a more detailed view of data conversion circuitry such as may be included within the peripheral circuitry 212 of a multi-mode memory in accordance with the principles of the present invention. In this illustrative embodiment logic level assignment circuitry 400 includes comparators COMP1, COMP2, and COMP3 and an encoder 402. The comparators are configured to receive a signal from a sense amplifier connected to a selected memory cell. The outputs of the comparators are presented to the encoder 402, which assigns logic values according to the list of FIG. 4B. A "MODE" input to the encoder controls the assignment of logic values (e.g., binary or quaternary).

The mode input also determines the number of data bits driven by the assignment circuitry 400 to input/output circuitry 404. That is, the assignment circuitry 400 drives one data line to the Input/Output circuitry 404 in the binary mode of operation and two data lines in the quaternary mode of operation. Similarly, address decoding circuitry within the peripheral circuitry 212 is responsive to the "MODE" input by accessing two cells within the memory array 200 for every "two bits" of data in the binary mode of operation, but accessing only one cell within the memory array for "two bits" of data in the quaternary mode of operation. For binary Mode, the undefined ranges R4 and R5 may be-instead allocated to a 0 or 1 (that is, adjusted to provide more margin for variation or noise in the resistance during subsequent reads).

The use of a Mode control, such as embodied by mode control circuit 114 may engage different timing and write algorithms appropriate to personalize the chip, timing and drivers to allow use of different sections or layers of the memory as one-time programmable memory (OTP) (with, for example, a diode in series with a breakdown layer), or with binary on one section or layer, quaternary on another section or layer, or other, "n-ary" on another section or layer. Additionally, Nand-Flash, Nor-Flash, DRAM, or SRAM may be located on the first level and engaged in parallel with phase change memory on one or more layers above. The one or more phase change memory layers may be configured in series with Ovonic Threshold Switches (OTS) or thin film diodes (or OTP using a diode and breakdown layer) devices on the first level.

Certain segments or layers using a binary mode may use PCM deposited alloys that are faster with faster timing sets appropriately selected by Mode for those layer or sections of the memory. Similarly, other sections or layers may be quaternary and use a composition referred to as GST 225 as the memory alloy, with the appropriate time set selected from those available in micro-code and selectable by Mode for the memory map. Such approaches allow a hierarchy of memory on the chip selectable with little or no mask changes, with personalization by Mode and alloy deposited (or breakdown layer for OTP).

Figure 5:
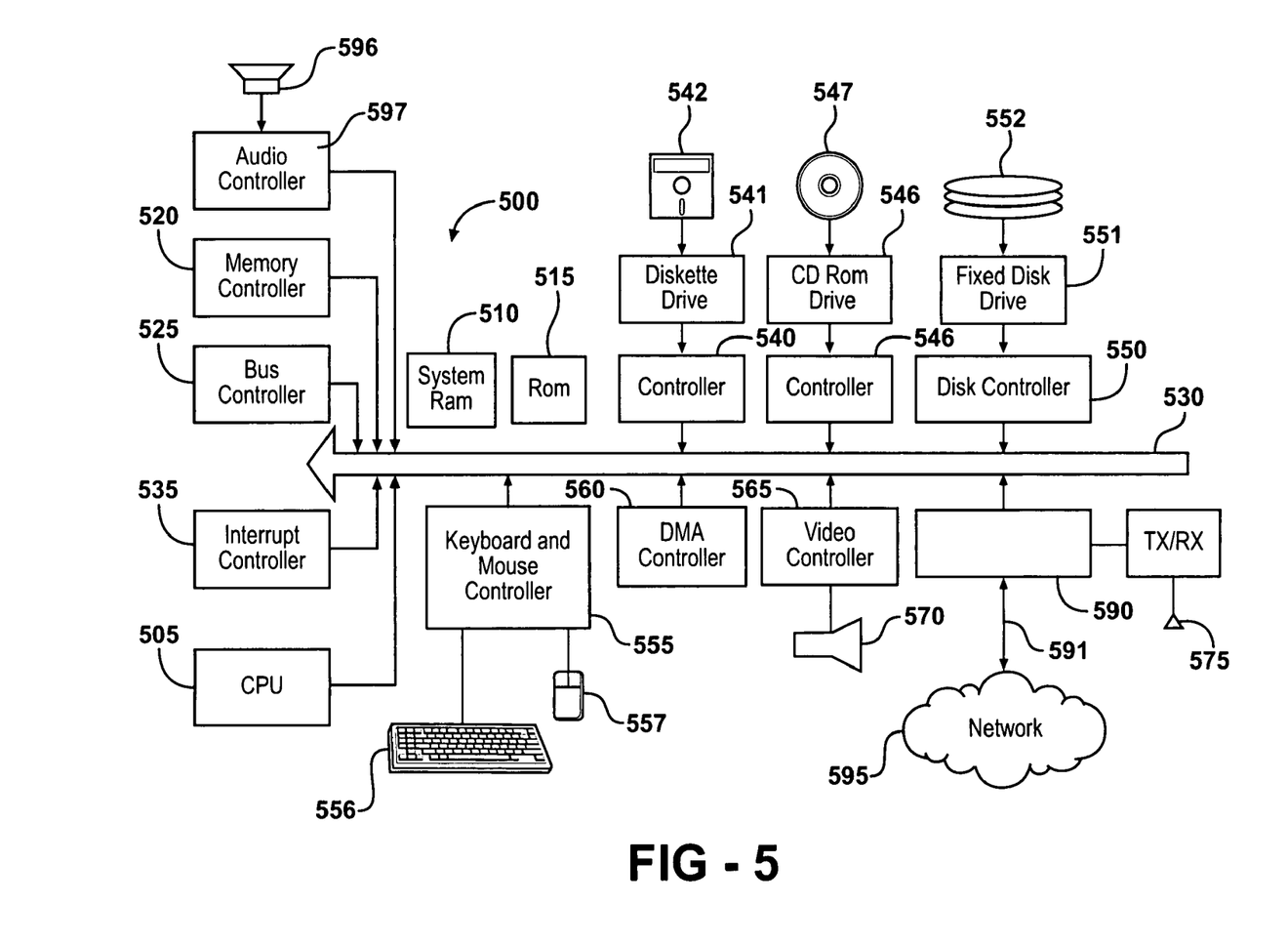
FIG. 5 is a conceptual block diagram of an electronic device that employs a phase change memory in accordance with the principles of the present invention.

The phase change electronic device(s) described in the discussion related to the previous figures may be employed to particular advantage in a wide variety of systems. The schematic diagram of FIG. 5 will be discussed to illustrate the devices' use in a few such systems. The schematic diagram of FIG. 5 includes many components and devices, some of which may be used for specific embodiments of a system in accordance with the principles of the present invention and while others not used. In other embodiments, other similar systems, components and devices may be employed. In general, the system includes logic circuitry configured to operate along with phase change memory. The logic circuitry may be discrete, programmable, application-specific, or in the form of a microprocessor, microcontroller, or digital signal processor, for example. And the embodiments herein may also be employed within the chips or connected to such circuitry. The exemplary system of FIG. 5 is for descriptive purposes only. Although the description may refer to terms commonly used in describing particular computer, communications, tracking, and entertainment systems, the description and concepts equally apply to other systems, including systems having architectures dissimilar to that illustrated in FIG. 5. The electronic system 500, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, a digital signal processor, or a radio frequency identification device. Any or all of the components depicted in FIG. 5 may employ a phase change memory or chalcogenide electronic device, such as a chalcogenide-based nonvolatile memory and/or threshold switch, for example.

In an illustrative embodiment, the system 500 may include a central processing unit (CPU) 505, which may be implemented with some or all of a microprocessor, a random access memory (RAM) 510 for temporary storage of information, and a read only memory (ROM) 515 for permanent storage of information. A memory controller 520 is provided for controlling RAM 510. In accordance with the principles of the present invention, all of, or any portion of, any of the memory elements (e.g. RAM or ROM) may be implemented as chalcogenide-based nonvolatile memory.

An electronic system 500 in accordance with the principles of the present invention may be a microprocessor that operates as a CPU 505, in combination with embedded chalcogenide-based electronic nonvolatile memory that operates as RAM 510 and/or ROM515, or as a portion thereof. In this illustrative example, the microprocessor/chalcogenide-nonvolatile memory combination may be standalone, or may operate with other components, such as those of FIG. 5 yet-to-be described.

In implementations within the scope of the invention, a bus 530 interconnects the components of the system 500. A bus controller 525 is provided for controlling bus 530. An interrupt controller 535 may or may not be used for receiving and processing various interrupt signals from the system components. Such components as the bus 530, bus controller 525, and interrupt controller 535 may be employed in a large-scale implementation of a system in accordance with the principles of the present invention, such as that of a standalone computer, a router, a portable computer, or a data storage system, for example.

Mass storage may be provided by diskette 542, CD ROM 547, or hard drive 552. Data and software may be exchanged with the system 500 via removable media such as diskette 542 and CD ROM 547. Diskette 542 is insertable into diskette drive 541 which is, in turn, connected to bus 530 by a controller 540. Similarly, CD ROM 547 is insertable into CD ROM drive 546 which is, in turn, connected to bus 530 by controller 545. Hard disc 552 is part of a fixed disc drive 551 which is connected to bus 530 by controller 550. Although conventional terms for storage devices (e.g., diskette) are being employed in this description of a system in accordance with the principles of the present invention, any or all of the storage devices may be implemented using chalcogenide-based nonvolatile memory in accordance with the principles of the present invention. Removable storage may be provided by a nonvolatile storage component, such as a thumb drive, that employs a chalcogenide-based nonvolatile memory in accordance with the principles of the present invention as the storage medium. Storage systems that employ chalcogenide-based nonvolatile memory as "plug and play" substitutes for conventional removable memory, such as disks or CD ROMs or thumb drives, for example, may emulate existing controllers to provide a transparent interface for controllers such as controllers 540, 545, and 550, for example.

User input to the system 500 may be provided by any of a number of devices. For example, a keyboard 556 and mouse 557 are connected to bus 530 by controller 555. An audio transducer 596, which may act as both a microphone and/or a speaker, is connected to bus 530 by audio controller 597, as illustrated. Other input devices, such as a pen and/or tabloid may be connected to bus 530 and an appropriate controller and software, as required, for use as input devices. DMA controller 560 is provided for performing direct memory access to RAM 510, which, as previously described, may be implemented in whole or part using chalcogenide-based nonvolatile memory devices in accordance with the principles of the present invention. A visual display is generated by video controller 565 which controls display 570. The display 570 may be of any size or technology appropriate for a given application.

In a cellular telephone or portable entertainment system embodiment, for example, the display 570 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 500 may also include a communications adaptor 590 which allows the system to be interconnected to a local area network (LAN) or a wide area network (WAN), schematically illustrated by bus 591 and network 595. An input interface 599 operates in conjunction with an input device 593 to permit a user to send information, whether command and control, data, or other types of information, to the system 500. The input device and interface may be any of a number of common interface devices, such as a joystick, a touch-pad, a touch-screen, a speech-recognition device, or other known input device. In some embodiments of a system in accordance with the principles of the present invention, the adapter 590 may operate with transceiver 573 and antenna 575 to provide wireless communications, for example, in cellular telephone, RFID, and wifi computer implementations.

Operation of system 500 is generally controlled and coordinated by operating system software. The operating system controls allocation of system resources and performs tasks such as processing scheduling, memory management, networking, and I/O services, among other things. In particular, an operating system resident in system memory and running on CPU 505 coordinates the operation of the other elements of the system 500.

In illustrative handheld electronic device embodiments of a system 500 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 555, keyboard 556 and mouse 557, for example. Embodiments with a transmitter, recording capability, etc., may also include a microphone input (not shown).

In an illustrative RFID transponder implementation of a system 500 in accordance with the principles of the present invention, the antenna 575 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 573 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a chalcogenide-based nonvolatile memory in accordance with the principles of the present invention. In this illustrative embodiment, data read out from the memory is transferred to the transceiver 573 as an "answerback" signal on the antenna 575 at a second carrier frequency $F_2$. In passive RFID systems power is derived from the interrogating signal and memory such as provided by a chalcogenide-based nonvolatile memory in accordance with the principles of the present invention is particularly well suited to such use.

For some use of the embodiments herein, the Controller 940 or CPU may send an electronic key to the Memory Controller or System memory such as Ram 910 or Rom 915, changing the memory from binary to quaternary so that the amount of memory is doubled but the timing used is slower (such as 2× for read, and 10× for write). Such a change may be done in the field under electronic control driving the Mode 114, such as use of an electronic key, or by changing the connection of certain pins to the Mode 114.

I claim:

1. An apparatus, comprising:
a phase change memory cell; and
mode-selection circuitry configured to receive and store information related to a choice of access modes for the phase change memory cell, the access modes including a first access mode specifying a first number of storage levels associated with operation of the phase-change memory cell and a second access mode specifying a second number of storage levels associated with operation of the phase-change memory cell.

2. The apparatus of claim 1, further comprising access circuitry configured to access the phase change memory cell according to a mode choice stored by the mode-selection circuitry.

3. The apparatus of claim 2, wherein the access circuitry comprises memory cell reading circuitry.

4. The apparatus of claim 1, wherein the first access mode has an even number of cell storage levels associated with it.

5. The apparatus of claim 4, wherein the first access mode has two cell storage levels associated with it.

6. The apparatus of claim 4, wherein the first access mode has four cell storage levels associated with it.

7. The apparatus of claim 2, wherein the mode selection circuitry includes a default mode.

8. The apparatus of claim 7 wherein the default mode is a binary storage mode.

9. The apparatus of claim 1, further comprising programming circuitry configured to write to the phase change memory cell according to a mode choice stored by the mode-selection circuitry, the mode choice being reflected in a characteristic of a current pulse generated by the programming circuitry to program the memory cell.

10. The apparatus of claim 9, wherein current amplitude is a characteristic of a current pulse dependent upon the mode choice.

11. The apparatus of claim 9, wherein current duration or trailing edge rate is a characteristic of a current pulse dependent upon the mode choice.

12. The apparatus of claim 9, wherein the number, duration, frequency, shape or amplitude of a series of current pulses is dependent upon the mode choice.

13. The apparatus of claim 9, further comprising reading circuitry, wherein the reading circuitry is configured to read the state of the memory cell according to a value stored in the mode selection circuitry.

14. The apparatus of claim 13, wherein the reading circuit is configured to read the state of the memory cell by sorting the value of an electrical characteristic of the memory cell into a plurality of groupings, the number of groupings and values delimiting those groupings dependent upon the two or more values stored in the mode selection circuitry.

15. The apparatus of claim 14 wherein resistance is the electrical characteristic of the memory cell.

16. The apparatus of claim 14 wherein the reading circuit is configured to sort values of the electrical characteristic into two groupings, thereby providing binary operation.

17. The apparatus of claim 14 wherein the reading circuit is configured to sort values of the electrical characteristic into four groupings, thereby providing quaternary operation.

18. The apparatus of claim 1, further comprising a microprocessor configured to initiate access of the mode-selected memory cell.

19. The apparatus of claim 18 further comprising a transceiver configured to transmit mode data from for the mode-selected memory.

20. The apparatus of claim 18 wherein the memory, microprocessor and transmitter/receiver are configured as a cellular telephone.

21. The apparatus of claim 18 wherein the memory, and microprocessor are configured as a handheld entertainment device.

22. The apparatus of claim 2, wherein the access circuitry comprises memory cell programming circuitry.

23. The apparatus of claim 1, further comprising microstore circuitry operatively coupled to the mode-selection circuitry, the microstore circuitry storing instructions for a pre-determined mode of operation of the phase-change memory cell.

24. The apparatus of claim 23, wherein the microstore circuitry stores instructions for a plurality of pre-determined modes of operation of the phase-change memory cell.

25. The apparatus of claim 23, further comprising a microsequencer, the microsequencer configured to select steps for a pre-determined mode of operation from the instructions stored in the microstore.

26. The apparatus of claim 25, wherein the microsequencer is configured to select the steps in response to a signal provided by the mode-selection circuitry.

27. The apparatus of claim 5, wherein the second access mode has four cell storage levels associated with it.

* * * * *